(12) United States Patent
Mar (10) Patent No.: US 6,621,277 B2
(45) Date of Patent: Sep. 16, 2003

(54) PHASE NOISE MEASUREMENT MODULE AND METHOD FOR A SPECTRUM ANALYZER

(75) Inventor: Wing Jong Mar, Rohnert Park, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 9 days.

(21) Appl. No.: 10/021,600

(22) Filed: Oct. 30, 2001

(65) Prior Publication Data

US 2003/0080724 A1 May 1, 2003

(51) Int. Cl.[7] .......................... G01R 23/20; G01R 23/00
(52) U.S. Cl. ..................................... 324/622; 324/76.19
(58) Field of Search ................................ 324/613, 614, 324/622, 76.22, 76.23, 76.27, 76.52, 76.53, 76.77, 76.85, 76.19

(56) References Cited

U.S. PATENT DOCUMENTS 6,166,533 A * 12/2000 Musha ..................... 324/76.27

OTHER PUBLICATIONS

Rhode & Schwarz Data Sheet for "Phase Noise Measurement Software FS–K4" for use with Spectrum Analyzer Models FSE/FSIQ/FSP/FSU.

Rhode & Schwarz help menus for using phase noise measurement software, Figs. 1–3, including "Making a Phase Noise Measurement".

\* cited by examiner

Primary Examiner—N. Le
Assistant Examiner—Donald M Lair (57) ABSTRACT

A phase noise measurement module (PNMM), system and method for measuring phase noise improve accuracy of phase noise measurements of a signal under test (SUT) using a spectrum analyzer. The PNMM includes an RF to hF frequency converter and a selectable frequency divider. The system includes the PNMM connected to the spectrum analyzer and employs an LO signal from a tunable LO in the spectrum analyzer. The method includes directly converting an input SUT to an IF signal having either a second or a third IF frequency that is applied to a corresponding frequency conversion stage of the spectrum analyzer before the phase noise is measured. The present invention bypasses a first conversion stage, and typically a second conversion stage as well, of the spectrum analyzer and directly converts the SUT to either the second or third IF frequency, thereby reducing phase noise added to the SUT.

29 Claims, 5 Drawing Sheets

PHASE NOISE MEASUREMENT MODULE AND METHOD FOR A SPECTRUM ANALYZER

TECHNICAL FIELD

The present invention relates to test equipment and measurements using test equipment. More particularly, the invention relates to measurement of phase noise of a signal under test.

BACKGROUND ART

Phase noise is noise that manifests itself as unwanted, usually random, fluctuations in a relative phase of a signal. Many modern systems, such as phased array radars, the global positioning satellite system (GPS) and communications systems that employ one or more forms of phase modulation, depend on precise, accurate knowledge of signal phase for their operation. Phase noise directly interferes with the operation of these and related systems. Therefore, the measurement of phase noise is an important topic in the field of test and measurement. In particular, an important objective of phase noise measurement is to obtain an accurate measurement of phase noise for a given signal under test (SUT).

There are a number of approaches known in the art for measuring phase noise, each method having its own advantages and disadvantages. For example, phase noise can be measured using a frequency discriminator or using a delay line and mixer as a frequency comparator. Another approach uses two sources and a phase comparator. Yet another approach measures phase noise using a heterodyne frequency measurement technique. However, among all of the approaches to phase noise measurement, perhaps the most popular, practical, and cost-effective approach employs a spectrum analyzer.

A spectrum analyzer is a device or system that measures the power spectral density (PSD) of a signal or one of several closely related signal parameters. For the purposes of discussion herein, the PSD of a signal can be thought of as a measurement of signal power in a selected bandwidth as a function of frequency. Typically, the spectrum analyzer displays measured PSD in the form of a graph. Phase noise measurements can be extracted or computed from measured PSD of the SUT. Most spectrum analyzers, especially those used for high frequency radio frequency (RF), are implemented as heterodyne receivers that frequency shift or frequency-convert the signal prior to detecting and measuring the power of the signal. A typical spectrum analyzer may employ three or four stages of frequency conversion prior to a signal power measurement. One or more of these frequency conversion stages generally utilizes a swept or stepped frequency local oscillator (LO) to provide frequency scanning or tuning.

Unfortunately, phase noise measurements obtained using spectrum analyzers inevitably contain errors that distort and in some cases, even obscure the true phase noise of the signal under test. In practice, the LOs, which are used in the various frequency conversions and in aspects of detecting and measuring signal power in the spectrum analyzer, introduce or add phase noise to the SUT being measured. The added phase noise is typically independent of the signal being measured and is solely due to the operations performed by the spectrum analyzer on the SUT. For example, a major source of added phase noise in the spectrum analyzer is phase noise of a first LO used in a first frequency conversion stage of the spectrum analyzer. The end result is that the magnitude of the phase noise, as measured by the spectrum analyzer, is generally greater than the true or actual phase noise of the SUT due to this added phase noise.

A conventional approach to mitigating the added phase noise effects of the spectrum analyzer used to measure phase noise of the SUT normally involves simply using a better spectrum analyzer. In simple terms, a better spectrum analyzer is one that has lower added phase noise. The lower the added phase noise, the less that added phase noise corrupts the measurements of phase noise of the SUT. Lower added phase noise in a spectrum analyzer is typically achieved by using cleaner, more stable LOs. This is especially true for the LO used in the first frequency conversion stage or stages. In addition, the sensitivity of the signal detection circuitry of the spectrum analyzer must be higher to avoid masking of the measured phase noise by internal thermal noise of the spectrum analyzer. Thus, a better spectrum analyzer, having lower added phase noise, is the result of using better, higher quality components to construct the spectrum analyzer.

However, improving the added phase noise performance in a spectrum analyzer (i.e. reducing added phase noise) typically comes at a price. Even moderate improvements in phase noise performance from one model of spectrum analyzer to another can often result in significant increases in unit price. The increased unit price is due in large part to increased costs of better, higher performance LOs and/or higher sensitivity detection circuitry necessary to implement spectrum analyzers with lower added phase noise. Much the same thing can be said for the other phase noise measurement approaches known in the art. Increased phase noise measurement accuracy using better measurement devices can become very, sometimes even prohibitively, expensive.

Accordingly, it would be advantageous to have a more economical approach to obtaining accurate phase noise measurements than simply using a better, more expensive spectrum analyzer. Moreover, it would be advantageous if such an approach could improve accuracy of phase noise measurements produced by virtually any spectrum analyzer, even ones with lower added phase noise. Such an approach would solve a long-standing need in the area of economical phase noise measurement using spectrum analyzers.

SUMMARY OF THE INVENTION

The present invention is a phase noise measurement module (PNMM) and method of measuring phase noise that, when used in conjunction with a spectrum analyzer, can improve the accuracy of phase noise measurements of a signal under test (SUT). According to the present invention, a first radio frequency (RF)-to-intermediate frequency (IF) conversion stage in the spectrum analyzer is bypassed during a phase noise measurement of a signal under test (SUT). Instead, the SUT is frequency converted directly to an IF signal having a center frequency that corresponds to either a second IF frequency or a third IF frequency of the spectrum analyzer. In addition, the direct conversion of the present invention generates a tunable direct conversion LO signal from a tunable local oscillator (LO) in the first conversion stage of the spectrum analyzer. The direct conversion LO signal is a frequency divided LO signal derived through the use of a selectable frequency divider. The frequency divided LO signal is mixed with the SUT in a frequency converter of the PNMM to produce the IF signal. The combination of direct conversion of the SUT and selectable frequency division of the LO signal of the present invention results in less added phase noise to the SUT and therefore, more accurate phase noise measurements, than can be achieved with the spectrum analyzer alone.

In one aspect of the invention, a PNMM or direct-conversion apparatus for use in conjunction with a spectrum analyzer having multiple frequency conversion stages is provided. The PNMM facilitates accurate phase noise measurements of an SUT performed using the multi-stage spectrum analyzer. Preferably, the spectrum analyzer used with the present invention has at least three IF frequency conversion stages. The PNMM has an RF input port, an LO input port and an IF output port and comprises an RF to IF frequency converter having an RF input port, an LO input port and an IF output port. The RF input port of the frequency converter is connected to the RF input port of the PNMM apparatus and the IF output port is connected to the IF output port of the PNMM. The PNMM further comprises a selectable frequency divider having an input port that is connected to the LO input port of the PNMM apparatus, and an output port that is connected to the LO input port of the frequency converter. The selectable frequency divider has a selectable division factor.

In some embodiments, the PNMM may further comprise a switch having an input port connected to the IF output port of the frequency converter and an output port connected to the PNMM IF output port. The switch directs an IF signal from the frequency converter to either the second conversion stage or the third conversion stage of the spectrum analyzer via the PNMM IF output port.

An SUT applied to the RF input port of the PNMM is filtered by an optional lowpass filter and passes on to the RF input port of the frequency converter. A tunable LO signal produced by the spectrum analyzer in the first conversion stage is applied to the LO input port of the PNMM apparatus and therethrough to the LO input port of the selectable frequency divider. The selectable frequency divider produces a frequency divided LO signal from the spectrum analyzer's first conversion stage tunable LO. The divided LO signal is mixed with the SUT in the frequency converter to produce an IF signal. The IF signal has a frequency that is centered either at a second IF frequency of the spectrum analyzer or a third IF frequency of the spectrum analyzer depending on the selected division factor of the selectable divider and a center frequency of the SUT. The IF signal passes to the IF output port of the PNMM apparatus, where it is routed to either the second or third frequency conversion stage of the spectrum analyzer, depending on the IF frequency of the produced IF signal.

In another aspect of the present invention, a system for measuring phase noise is provided. The system of the present invention comprises the PNMM described above, and further comprises a spectrum analyzer having multiple conversion stages, an RF input, an LO output connected to a second output of a tunable LO in a first conversion stage of the spectrum analyzer, and an additional IF input in each of a second and a third conversion stages. The LO output of the spectrum analyzer is connected to the PNMM at the PNMM LO input port. The IF input of the second and third conversion stages are connected to the PNMM at the PNMM IF output port. The PNMM bypasses the first conversion stage of the spectrum analyzer and directly converts a SUT into an IF signal having a frequency centered at either the second or third IF frequency of the spectrum analyzer.

In still another aspect of the present invention, a method of measuring phase noise using a spectrum analyzer that has multiple frequency conversion stages is provided. The method of measuring phase noise comprises directly converting an input signal under test at an input of the spectrum analyzer to an IF signal having either a second or a third IF frequency. The IF signal is routed to a second or a third frequency conversion stage of the spectrum analyzer, depending on the IF frequency of the IF signal, before phase noise is measured.

The SUT is directly converted comprising frequency dividing a tunable first LO signal from a first conversion stage of the spectrum analyzer, and mixing the divided tunable LO signal with the SUT to produce the IF signal. Either the second or the third frequency conversion stage is selected and the IF signal is applied to the selected second or third frequency conversion stage of the spectrum analyzer. The method of measuring phase noise optionally further comprises identifying and locating any frequency components of the SUT that lie at image frequencies of the direct conversion. Phase noise is measured by processing the directly converted IF signal in a conventional manner using the spectrum analyzer.

The present invention facilitates obtaining more accurate phase noise measurements than the conventional approaches that employ the spectrum analyzer alone. The present invention improves phase noise measurement accuracy primarily by reducing the phase noise added to the SUT by the multiple frequency conversions of the SUT in the spectrum analyzer. To begin with, bypassing the first two RF to IF conversion stages in the spectrum analyzer essentially eliminates phase noise added to the SUT by the first and second LOs of the spectrum analyzer. What phase noise is added to the SUT by the tunable direct conversion LO signal of the invention is minimized by frequency dividing the LO signal from the tunable LO of the spectrum analyzer.

Advantageously, the present invention can improve the accuracy of phase noise measurements obtained using almost any spectrum analyzer provided that access to the tunable first LO, second IF stage, and third IF stage of the spectrum analyzer is provided. Thus, even measurements obtained with high performance spectrum analyzers can be improved according to the present invention. Certain embodiments of the present invention have other advantages in addition to and in lieu of the advantages described hereinabove. These and other features and advantages of the invention are detailed below with reference to the following drawings.

BRIEF DESCRIPTION OF THE DRAWINGS

The various features and advantages of the present invention may be more readily understood with reference to the following detailed description taken in conjunction with the accompanying drawings, where like reference numerals designate like structural elements, and in which.

MODES FOR CARRYING OUT THE INVENTION

The present invention is a phase noise measurement module (PNMM) or apparatus for use in conjunction with a spectrum analyzer, method of measuring phase noise utilizing the PNMM and the spectrum analyzer and a system comprising the PNMM and a spectrum analyzer. The present invention facilitates improved accuracy of phase noise measurements of a signal under test (SUT). The improved accuracy afforded by the present invention is due primarily to a reduction in phase noise added to the SUT during a measurement of SUT phase noise using a spectrum analyzer. The PNMM, system and method of the present invention can be used with, and improve the phase noise measurement accuracy of, many spectrum analyzers, especially radio frequency (RF) spectrum analyzers that lack a tunable preselector filter.

In general, phase noise can be viewed as a measure of the short-term stability of a signal S(t). The phase noise is a measure of noise power as a function of frequency offset from a carrier frequency $f_c$ of the signal S(t). Although there are several commonly used definitions for signal characteristics associated with phase noise, for the purposes of simplicity of discussion herein, only phase noise defined as single sided phase noise $\mathcal{L}(f_m)$ will be described with respect to the invention. Single sided phase noise $\mathcal{L}(f_m)$ is the ratio of the single sideband power of phase noise in a 1-Hz bandwidth at an offset frequency $f_m$ measured from a carrier frequency $f_c$ to the total power of the signal. Single sideband phase noise $\mathcal{L}(f_m)$ is normally given in terms of dBc/Hz where 'dBc' refers to Decibels relative to the carrier frequency. In general, the discussion herein below applies equally to other commonly used signal characteristic definitions associated with phase noise, as one skilled in the art will readily recognize, and all signal characteristic definitions are within the scope of the present invention. Thus, the discussion hereinbelow, while describing the invention with respect to single sideband phase noise $\mathcal{L}(f_m)$ for simplicity purposes only, does not limit the scope of the present invention in any way.

Figure 1:
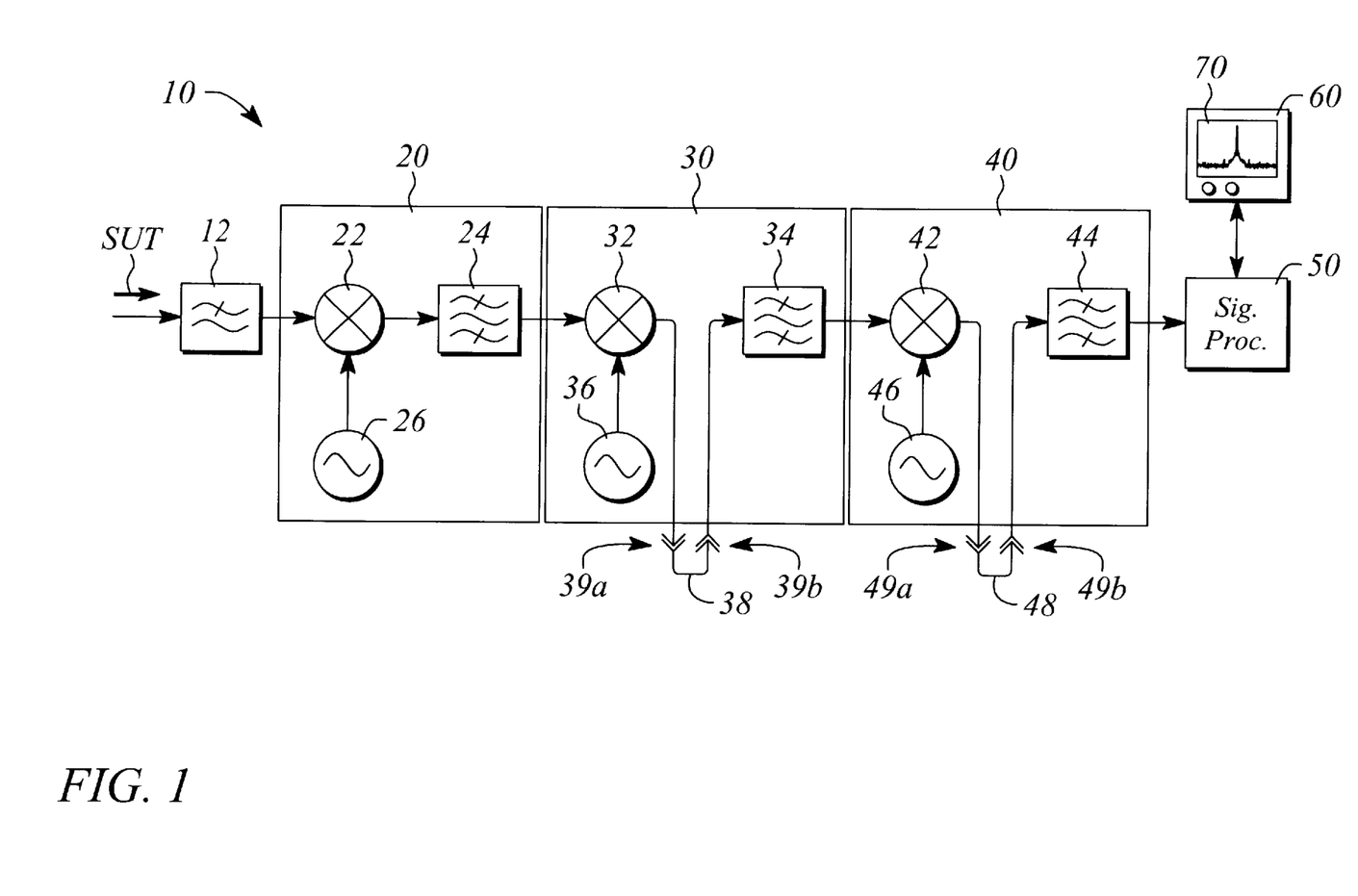
FIG. 1 illustrates a block diagram of an embodiment of a typical three-stage spectrum analyzer.

As mentioned hereinabove, one method of measuring phase noise of a SUT uses a spectrum analyzer. FIG. 1 illustrates a conceptual block diagram of a typical three-stage RF spectrum analyzer 10 based on a heterodyne receiver architecture. The three-stage RF spectrum analyzer 10 illustrated in FIG. 1 is included for descriptive purposes only and is not intended to limit the scope of the present invention in any way.

The spectrum analyzer 10 illustrated in FIG. 1 comprises a lowpass filter 12, a first frequency conversion stage 20, a second frequency conversion stage 30, a third frequency conversion stage 40, and a signal processor 50. An output of the lowpass filter 12 is connected to a stage input of the first frequency conversion stage 20. A stage output of the first frequency conversion stage 20 is connected to a stage input of the second conversion stage 30. A stage output of the second conversion stage 30 is connected to a stage input of the third frequency conversion stage 40, a stage output of which is connected to an input of the signal processor 50.

The first frequency conversion stage 20 comprises a mixer 22 having an RF port, a local oscillator (LO) port, and an intermediate frequency (IF) port. The RF port of the mixer 22 is connected to the stage input of the first conversion stage 20. The first frequency conversion stage 20 further comprises a bandpass filter 24 having a center frequency called the first IF frequency $f1_{IF}$ and a tunable local oscillator (LO) 26 that produces a tunable LO signal $S1_{LO}(t)$ having a tunable fundamental frequency $f1_{LO}$. The bandpass filter 24 is connected between the IF port of the mixer 22 and the stage output of the first conversion stage 20 while the tunable LO 26 is connected to the LO port of the mixer 22. The first frequency conversion stage 20 converts an RF signal $S_{RF}(t)$ having a center frequency $f_{RF}$ applied to its input to a first IF signal $S1_{IF}(t)$ at the first IF frequency $f1_{IF}$.

Typically in RF spectrum analyzers, the first IF frequency $f1_{IF}$ is higher than a highest or maximum RF frequency $fmax_{RF}$ of any possible input RF signal $S_{RF}(t)$. The first IF frequency $f1_{IF}$ is higher than the maximum RF frequency $fmax_{RF}$ in order to avoid or minimize problems with so-called 'image' components or frequencies in the frequency conversion (i.e., $f_{image}=f_{RF}+2 \cdot f1_{IF}$, where $f_{image}$ is the frequency of the image signal capable of causing the same response as the true signal $S_{RF}(t)$ at frequency $f_{RF}$). One skilled in the art of frequency conversion is familiar with image frequencies. In addition and, in part as a result, a minimum frequency $f1min_{LO}$ of the tunable LO signal $S1_{LO}(t)$ is also generally higher than the maximum RF frequency $fmax_{RF}$ (i.e., $fmax_{RF}<f1min_{LO}$). A cutoff frequency of the lowpass filter 12 typically sets or determines the maximum RF frequency $fmax_{RF}$ and blocks the image signal so that only the true signal below $fmax_{RF}$ can be detected by the spectrum analyzer.

For example, consider an RF spectrum analyzer that accommodates an input RF signal $S_{RF}(t)$ having a frequency $f_{RF}$ between 0 and 3 GHz (i.e., $fmax_{RF}=3$ GHz). Such a spectrum analyzer might employ a first conversion stage having a first IF frequency $f1_{IF}$ of 3.9214 GHz. To accommodate tuning over the entire RF signal frequency range given the first IF frequency $f1_{IF}$ of 3.9214 GHz, the tunable LO signal $S1_{LO}(t)$ for this example would have a tunable frequency range of at least 3.9214 GHz to 6.9214 GHz. Moreover, the image signal for this example at $f_{RF}+2 \cdot f1_{IF}$ is in the frequency range of 7.8428 GHz to 10.8214 GHz, a range that can be easily blocked by the input lowpass filter 12.

The second frequency conversion stage 30 comprises a mixer 32 having a RF port, an LO port, and an IF port. The RF port of the mixer 32 is connected to the stage input of the second conversion stage 30. The second frequency conversion stage 30 further comprises a bandpass filter 34 having a center frequency at a second IF frequency $f2_{IF}$ and a LO 36 that produces an LO signal $S2_{LO}(t)$ having a fundamental frequency $f2_{LO}$. An output of the bandpass filter 34 is connected to the stage output of the second conversion stage 30 while the LO 36 is connected to the LO port of the mixer 32. The second conversion stage 30 further comprises a removable jumper 38 between the IF port of the mixer 32 and an input of the bandpass filter 34. When the removable jumper 38 is removed, the second conversion stage 30 has an IF output 39a connected to the IF port of the mixer 32 and an IF input 39b connected to the input of the bandpass filter 34. The second frequency conversion stage 30 converts the first IF signal $S1_{IF}(t)$ of the first conversion stage 20 to a second IF signal $S2_{IF}(t)$ at the second IF frequency $f2_{IF}$.

With most spectrum analyzers, the second IF frequency $f2_{IF}$ is lower, usually much lower, than the first IF frequency $f1_{IF}$. For example, a second conversion stage 30 of a typical spectrum analyzer might have a first IF frequency $f1_{IF}=$ 3.9214 GHZ and a second IF frequency $f2_{IF}=321.4$ MHz. In this case, the LO 36 would typically produce an LO signal $S2_{LO}(t)$ having a fundamental frequency $f2_{LO}$=3.6 GHz.

The third frequency conversion stage 40 is similar to the second conversion stage 30. In particular the third conversion stage 40 comprises a mixer 42 having an RF port, an LO port, and an IF port, the RF port being connected to the stage input of the third conversion stage 40. The third frequency conversion stage 40 further comprises a bandpass filter 44 having a center frequency at a third IF frequency $f3_{IF}$ and a LO 46 that produces an LO signal $S3_{LO}(t)$ having a fundamental frequency $f3_{LO}$. An output of the bandpass filter 44 is connected to the stage output of the third conversion stage 40 while the LO 46 is connected to the LO port of the mixer 42. As with the second conversion stage 30, the third conversion stage 40 further comprises a removable jumper 48 between the IF port of the mixer 42 and an input of the bandpass filter 44. When the removable jumper 48 is removed, the third conversion stage 40 has an IF output 49a connected to the IF port of the mixer 42 and an IF input 49b connected to the input of the bandpass filter 44. The third frequency conversion stage 40 converts the second IF signal $S2_{IF}(t)$ of the second conversion stage 30 to a third IF signal $S3_{IF}(t)$ at the third IF frequency $f3_{IF}$.

Typically, the third IF frequency $f3_{IF}$ is lower than the second IF frequency $f2_{IF}$. The third IF frequency $f3_{IF}$ is often chosen to be a convenient frequency for input to and processing by the signal processor 50. For example, the third conversion stage 40 of a typical spectrum analyzer might have the second IF frequency $f2_{IF}$=321.4 MHz and the third IF frequency $f3_{IF}$=21.4 MHz. In this case, the LO 46 would typically produce an LO signal $S3_{LO}(t)$ having a fundamental frequency $f3_{LO}$=300 MHz.

A signal $S_{RF}(t)$ applied to an input of the conventional three-stage spectrum analyzer illustrated in FIG. 1 is filtered by the filter 12 and then frequency converted and bandpass filtered by the first frequency conversion stage 20 to produce a filtered version of the first IF signal $S1_{IF}(t)$. The second frequency conversion stage 30 then frequency converts and filters the filtered first IF signal $S1_{IF}(t)$ to produce a filtered version of the second IF signal $S2_{IF}(t)$. Similarly, the third frequency conversion stage 40 converts and bandpass filters the filtered second IF signal $S2_{IF}(t)$ to produce a filtered version of the third IF signal $S3_{IF}(t)$. After the third frequency conversion, the signal is detected and processed by the signal processor 50. Together, these elements 12, 20, 30, 40, 50, comprise a signal conversion and detection portion of the spectrum analyzer 10. Other architectures for the signal conversion and detection portion are known in the art. In particular, many modem spectrum analyzers have signal and detection portions that employ more than three frequency conversions. All such spectrum analyzers are considered to be within the scope of the present invention.

In addition to the signal conversion and detection portion, most spectrum analyzers 10 further comprise a control portion 60 that includes a display 70. The control portion 60 controls the operation of the spectrum analyzer 10. Measured results obtained by the spectrum analyzer 10 are displayed as data on the display 70 in a graphical format. The display 70 also often serves as part of a user interface allowing a user to interact with the control portion 60 in addition to providing data display.

Tuning, or more commonly referred to as 'frequency scanning' when discussing spectrum analyzers 10, is accomplished by the tunable LO 26 of the first conversion stage 20. A tuning controller (not illustrated) of the tunable LO 26 adjusts the frequency $f1_{LO}$ of the LO signal $S1_{LO}(t)$. For example, the tuning controller may comprise a ramp generator that produces a ramped voltage. The tunable LO 26 may be a voltage controlled oscillator (VCO) that is tuned by the ramped voltage. More commonly, the tuning controller and tunable LO 26 are combined together and implemented as a tunable frequency synthesizer. A more detailed discussion of the operational and architectural details of spectrum analyzers is beyond the scope of the present discussion. However, one of ordinary skill in the art is familiar with spectrum analyzers and their operation.

To perform a phase noise measurement using a conventional spectrum analyzer 10, the SUT having a carrier frequency $f_c$ is applied to the input of the spectrum analyzer 10. The spectrum analyzer 10 sweeps a frequency range containing the SUT carrier frequency $f_c$ and measures signal power detected in a given, selectable bandwidth at a number of frequencies within the frequency range. The measured signal power is recorded by the spectrum analyzer 10 as a set of measured data values. The frequency sweep can be either a continuous sweep or a stepped sweep consisting of discrete frequency points within the frequency range. In either case, a power spectrum of the SUT is produced from the measured signal power data. Often the power spectrum is plotted as magnitude versus frequency on the display 70 of the spectrum analyzer 10.

Figure 2:
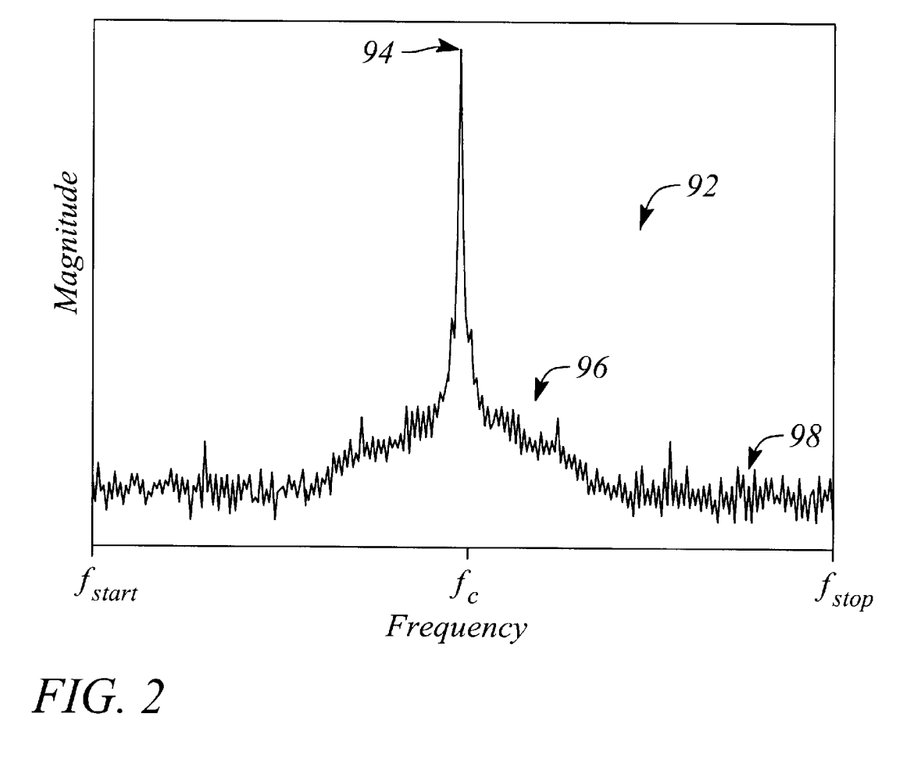
FIG. 2 illustrates an example of a typical power spectrum of an SUT as may be produced by the spectrum analyzer illustrated in FIG. 1.

An example of a typical power spectrum 92 of an SUT 94 that might be produced by a spectrum analyzer is illustrated in FIG. 2. As illustrated in FIG. 2, the frequency range is from a frequency $f_{start}$ to a frequency $f_{stop}$. A carrier of the SUT 94 is represented by a high-magnitude, narrow bandwidth portion of the spectrum 92 at a carrier frequency $f_c$. Phase noise associated with the SUT 94 accounts for an increase in a noise level 96 in the vicinity of the carrier frequency $f_c$ of the SUT 94 relative to a spectrum analyzer noise floor or limit 98 at frequencies away from the carrier frequency $f_c$.

The measured phase noise $\mathcal{L}(f_m)$ of the SUT is computed from the power spectrum by taking a ratio of the power measured at a set of offset frequencies $f_m$ to power measured at the carrier frequency $f_c$. Of course, the measured phase noise at the intermediate frequency (IF) stage of the spectrum analyzer includes added phase noise $\mathcal{L}_{SA}(f_m)$ contributed by the spectrum analyzer as well as the actual phase noise $\mathcal{L}_A(f_m)$ of the SUT. As mentioned hereinabove, a principal source of added phase noise in most spectrum analyzers is the tunable LO signal of the first conversion stage 20. A more detailed discussion of measuring phase noise using spectrum analyzers is readily available in a variety of textbooks and other sources including application and product notes from spectrum analyzer manufacturers. For example, one such product note is Agilent Technologies Product Note PN 89400-2, *Measuring Phase Noise with the Agilent 89400 Series Vector Signal Analyzer*, incorporated by reference herein.

In one aspect of the invention, a phase noise measurement module (PNMM) 100 for use in conjunction with a spectrum analyzer, such as for example the spectrum analyzer 10 embodiment illustrated in FIG. 1, is provided. The PNMM 100 provides a direct conversion of the SUT to an IF signal that has a frequency centered on either the second IF frequency $f2_{IF}$ or the third IF frequency $f3_{IF}$ of the spectrum analyzer. As such, the PNMM 100 facilitates accurate phase noise measurements of an SUT performed using the spectrum analyzer. Preferably, the spectrum analyzer has at least three frequency conversion stages, as described above for the spectrum analyzer 10 illustrated in FIG. 1.

Figure 3:
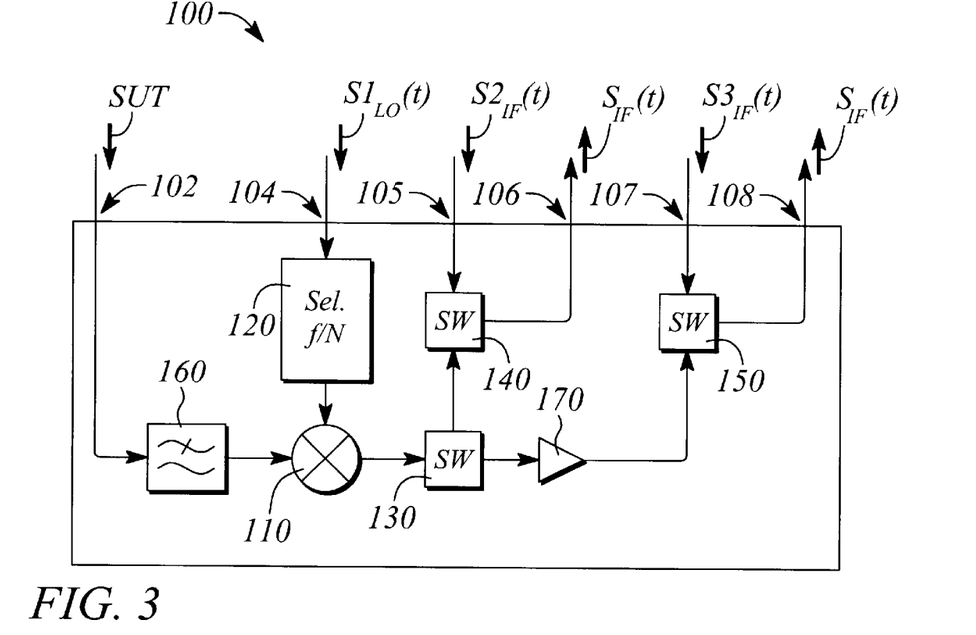
FIG. 3 illustrates a block diagram of a direct-conversion apparatus according to the present invention.

FIG. 3 illustrates a block diagram of the PNMM 100 of the present invention. The PNMM 100 comprises an RF port 102 that receives the SUT, an LO port 104 that receives a tunable LO signal, a first IF input port 105, a first IF output port 106, a second IF input port 107, and a second IF output port 108. The IF input ports 105, 107 are optional. Preferably, the tunable LO signal $S_{LO}(t)$ is the tunable LO signal $S1_{LO}(t)$ produced by the tunable LO 26 of the first conversion stage 20 of the example spectrum analyzer 10.

The PNMM 100 further comprises an RF to IF frequency converter 110 having an RF input port, an LO input port and an IF output port. Preferably, the frequency converter 110 is an RF to IF mixer. The RF input port of the frequency converter 110 is connected to the RF input port 102 of the PNMM 100. The IF output port of the frequency converter 110 is connected to an IF output port 106, 108 of the PNMM 100. The PNMM 100 further comprises a selectable frequency divider 120, an input port of which is connected to the LO port of the PNMM 100 and an output of which is connected to the LO input port of the frequency converter 110. The selectable frequency divider 120 divides a frequency f of a signal applied to the divider input port by a selectable division factor N and produces a divided frequency f/N at the divider output port. The division factor N is preferably an integer value, which makes the frequency divider much easier to implement.

Figure 4:
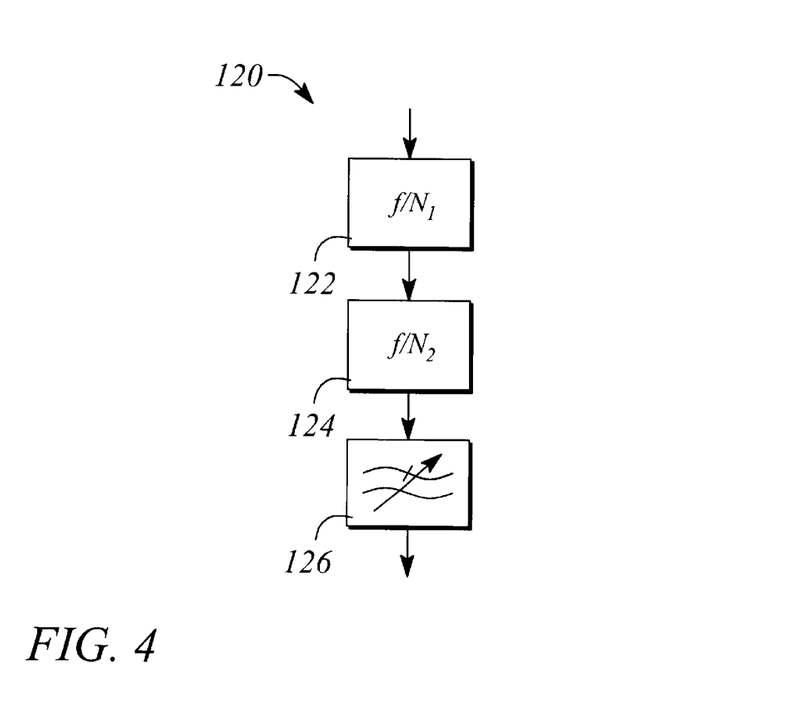
FIG. 4 illustrates a block diagram of an embodiment of a selectable frequency divider according to the present invention.

FIG. 4 illustrates a block diagram of a preferred embodiment of the selectable frequency divider 120 according to the present invention. In the preferred embodiment, the selectable frequency divider 120 comprises a first divider 122, a selectable divider module 124, and a selectable lowpass filter module 126. The first divider 122 has a first division factor $N_1$, where $N_1$ is an integer. In the preferred embodiment, the first divider 122 has a first division factor $N_1$, equal to two. Thus, a signal applied to an input of the divider 122 having a frequency f exits the divider 122 having a frequency $f/N_1$ (or preferably f/2). The first divider 122 acts as a prescaler to effectively reduce a frequency range of signals that are ultimately applied to the selectable divider module 124. In practice, the reduced frequency range facilitates implementation of the selectable divider module 124.

The selectable divider module 124 divides a frequency f of a signal applied to an input by a second division factor $N_2$. Thus, a signal entering the selectable divider module 124 having a frequency f exits the module 124 having a frequency $f/N_2$. The second division factor $N_2$ of the divider module 124 is selectable. For example, the second division factor $N_2$ may be selected to be one of the set $\{1, 2, 4, 8, 16\}$. Therefore, when a signal having a frequency $f/N_1$ exits the first divider 122 and is applied to the input of the divider module 124 and the selectable division factor $N_2$ is selected to be 4, the signal will exit the selectable divider module 124 having a frequency $(f/N_1)/4$. One of ordinary skill in the art is familiar with such a selectable frequency divider module. Moreover, one of ordinary skill in the art will readily recognize that the selectable division factor N of the selectable frequency divider 120 is the product of the first division factor $N_1$ and the second, selectable division factor $N_2$ (i.e., $N=N_1N_2$).

The selectable lowpass filter module 126 filters out spurious signals produced by the selectable divider module 124. In particular, the filter module 126 helps to remove higher order frequency products from an output signal of the selectable divider 124. For example, the selectable lowpass filter module 126 may comprise a set of lowpass filters and a single pole multiple throw switch. Each different lowpass filter of the set has a cutoff frequency chosen to filter out higher order components produced by selectable divider 124 for a different one of each of the selectable division factors N. Alternatively, the set of lowpass filters may have cutoff frequencies that correspond to various different key frequencies within a possible range of frequencies of the output of the selectable divider module 124. One skilled in the art can readily determine a suitable set of lowpass filters and a specific implementation of the selectable lowpass filter module 126 without undue experimentation. In some implementations of the selectable frequency divider 120 and/or PNMM 100, the selectable lowpass filter module 126 is not needed and may be omitted.

In another embodiment, a tracking bandpass filter (not illustrated) is used instead of the selectable lowpass filter 126. The tracking bandpass filter helps to filter out the broadband phase noise as well as any spurious signal from the selectable divider module 124. Unfortunately, a tracking bandpass filter with a sufficiently wide frequency tracking range is difficult to implement, especially at RF frequencies. Thus, even though the selectable lowpass filter 126 offers little reduction in the phase noise floor of the selectable divider, the selectable lowpass filter 126 is generally preferred since it is much easier to implement in practice.

The PNMM 100 preferably further comprises a first switch 130, a second switch 140, and a third switch 150 connected between the IF output port of the frequency converter 110 and the IF output port 106, 108 of the PNMM 100. An input port of the first switch 130 is connected to the IF output port of the frequency converter 110. A first output port of the first switch 130 is connected to a first input port of the second switch 140 and a second output port of the first switch 130 is connected to a first input port of the third switch 150. An output of the second switch 140 is connected to the first IF output port 106 of the PNMM 100 while an output port of the third switch 150 is connected to the second IF output port 108 of the PNMM 100. A second input port of the second switch 140 is connected to the first IF input port 105 of the PNMM 100 while a second input port of the third switch 150 is connected the second IF input port 107 of the PNMM 100.

The PNMM 100 may further comprise a filter 160 connected between the RF input 102 of the PNMM 100 and the RF input of the frequency converter 110. Preferably, the filter 160 is a tracking bandpass filter. The use of a tracking bandpass filter 160, sometime called a preselector, helps to prevent any possible image signal(s) from reaching the input of the frequency converter 10 of the PNMM 100. However, a tracking bandpass filter 160 with sufficient tracking range is often difficult to realize in practice, especially at RF frequencies. As an alternative, the filter 160 may be a lowpass filter since for typical phase noise measurement applications, the SUT is a known, single-tone signal and image signals either do not exist or are not a concern. The use of a tracking filter 160 does allow the PNMM 100 to behave more like a spectrum analyzer in that the tracking filter 160 enables the PNMM 100 to 'pick off' or isolate a particular signal from among a group of several signal and perform phase noise measurements on the isolated signal without interference from the other signals.

The PNMM 100 may further comprise an amplifier 170 connected between the second output port of the first switch 130 and the first input port of the third switch 150. The amplifier 170 helps to boost signal levels of signals entering the third switch 150. Additional amplifiers may be added to the PNMM 100 in other locations or points within PNMM 100. These additional amplifiers may be added, for example, to compensate for loss, adjust signal levels and/or improve reverse isolation at various points in the PNMM 100 without departing from the overall scope of the present invention. The switches 130, 140, 150 are preferably single pole, double throw (SPDT) RF or microwave switches. More preferably, the SPDT switches 130, 140, 150 exhibit relatively low loss and high isolation at the frequencies of the IF signals that pass through the respective switches 130, 140, 150. For example, a switch fabricated using microelectromechanical system (MEMS) technology has low loss and high isolation. Switches based on more conventional technology such as pin diode based switches, especially those with multiple stages for improved isolation, can be used as well. One skilled in the art is familiar with a variety of switch technologies and switch types that can provide acceptable performance (isolation and loss) and be used as switches 130, 140, and 150.

Figure 5:
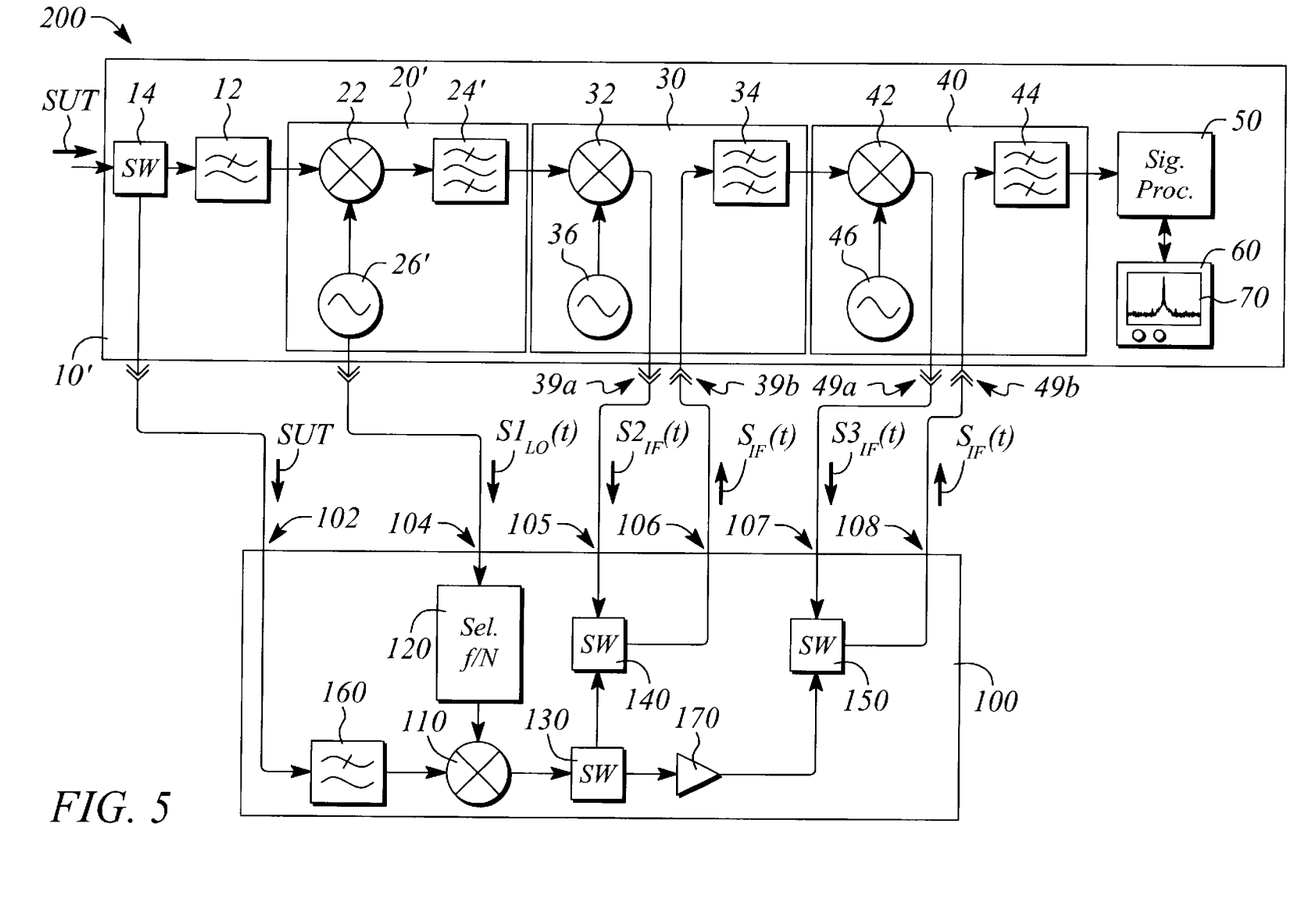
FIG. 5 illustrates a block diagram of an embodiment of a direct-conversion apparatus connected to a three-stage spectrum analyzer according to the present invention.

FIG. 5 illustrates a block diagram of a preferred embodiment of a system 200 for measuring phase noise according to the present invention. The system 200 comprises the PNMM 100 and a three-stage spectrum analyzer 10' connected together. For simplicity of discussion herein, the spectrum analyzer 10' of the system 200 is essentially that which is illustrated and described with respect to FIG. 1. However, as illustrated in FIG. 5, the spectrum analyzer 10' further comprises a switch 14 that can be used to direct the SUT applied to the input of the spectrum analyzer 10 to either the lowpass filter 12 of the spectrum analyzer 10' or to the RF input port 102 of the PNMM 100. In an alternative embodiment (not illustrated), the SUT can be applied directly to either the RF input port 102 of the PNMM 100 or the RF input port of the spectrum analyzer 10' without a switch, as desired.

In the spectrum analyzer 10' in the system 200 illustrated in FIG. 5 the first conversion stage 20' further has an LO output connected to a second output of the tunable LO 26'. The LO output is connected to the LO input port 104 of the PNMM 100. The tunable LO 26' provides the tunable LO signal $S1_{LO}(t)$ with frequency $f1_{LO}$ to the LO input port 104 of the PNMM 100.

The spectrum analyzer 10' still further has the jumpers 38, 48 removed from the second and third conversion stages 30, 40, thereby making accessible IF output 39a, 49a and IF input 39b, 49b to the second and third conversion stages 30, 40, respectively. The IF output 39a of the second conversion stage 30 is connected to the first IF input port 105 of the PNMM 100 while the first IF output port 106 of the PNMM 100 is connected to the IF input 39b of the second conversion stage 30. The IF output 49a of the third conversion stage 40 is connected to the second IF input port 107 of the PNMM 100 while the second IF output port 108 of the PNMM 100 is connected to the IF input 49b of the third conversion stage 40.

Once the SUT enters the RF input port 102 of the PNMM 100, it is filtered by the lowpass filter 160 and passes on to the RF input port of the frequency converter 110. The tunable LO signal $S1_{LO}(t)$ with frequency $f1_{LO}$ from the first conversion stage 20' of the spectrum analyzer 10' is applied to the LO input port 104 of the PNMM 100 and therethrough to the input port of the selectable frequency divider 120. The selectable frequency divider 120 divides the frequency $f1_{LO}$ by the selectable division factor N and produces a frequency divided LO signal $SN_{LO}(t)$, the frequency of which is equal to $f1_{LO}/N$. The frequency divided LO signal $SN_{LO}(t)$ is mixed with the SUT in the frequency converter 110 to produce an IF signal $S_{IF}(t)$ at the first input port of the first switch 130.

The IF signal $S_{IF}(t)$ has a frequency that is centered at either the second IF frequency $f2_{IF}$ or the third IF frequency $f3_{IF}$ of the spectrum analyzer 10' depending on the selected integer division factor N of the selectable frequency divider 120 and the center frequency $f_c$ of the SUT. The first switch passes the IF signal $S_{IF}(t)$ either to the second switch 140 or third switch 150 depending on how the first switch 130 is configured or set. How the first switch 130 is configured depends on whether the frequency of the IF signal $S_{IF}(t)$ is center at the second If frequency or the third IF frequency. For example, if the frequency of the IF signal $S_{IF}(t)$ is centered at the second IF frequency $f2_{IF}$, then the first switch 130 is configured to route the signal to the second switch 140. Alternatively, if the frequency of the IF signal $S_{IF}(t)$ is centered at the third IF frequency $f3_{IF}$, then the first switch 130 is configured to route the signal to the third switch 150.

From either the second switch 140 or third switch 150, the IF signal $S_{IF}(t)$ then passes on to either the first IF output port 106 or second IF output port 108 of the PNMM 100, respectively. The IF signal $S_{IF}(t)$ exiting the first IF output port 106 enters the second conversion stage 30 of the spectrum analyzer 10' and is filtered by the second IF bandpass filter 34. The IF signal $S_{IF}(t)$ exiting the second IF output port 108 enters the third conversion stage 40 of the spectrum analyzer 10' and is filtered by the third IF bandpass filter 44. Therefore, depending on how the switches 130, 140, 150 are configured, the IF signal $S_{IF}(t)$ is applied to either the IF input 39b of the second stage 30 or the IF input 49b of the third stage 40 of the spectrum analyzer 10'.

Advantageously, the system 200 of the present invention also can process an SUT in a conventional manner. For conventional processing, the IF signal $S2_{IF}(t)$ from the second conversion stage 30 of the spectrum analyzer 10' is routed to the first IF input port 105 of the PNMM 100 and the IF signal $S3_{IF}(t)$ from the third conversion stage 40 of the spectrum analyzer 10' is routed to the second IF input port 107 of the PNMM 100. The second and third switches 140, 150 of the PNMM 10 are used to connect the IF outputs 39a, 49a to their respective IF inputs 39b, 49b, so that the spectrum analyzer 10' functions in a conventional manner. Essentially, the spectrum analyzer 10' ignores inputs from the PNMM 100, or equivalently, the switches 140, 150 function as the jumpers 38, 48 in the conventional spectrum analyzer 10. Moreover, in the direct conversion processing, the PNMM 100 may route the IF signal $S_{IF}(t)$ to the second conversion stage 30 at its IF input 39b where the IF signal $S_{IF}(t)$ is filtered by filter 34 and then converted in the third conversion stage 40. In this third conversion, the switch 150 acts as the jumper 48 in the conventional processing, so that the PNMM 100 generated IF signal $S_{IF}(t)$ is then ultimately processed by the signal processor 50. Thus, the SUT may be either routed through the spectrum analyzer 10' in a convention manner or routed through the PNMM 100, depending on the configuration of the switch 14 and the first, second and third switches 130, 140, 150. In the end, the SUT is processed by the signal processor 50 of the spectrum analyzer 10' whether or not the SUT passes through the PNMM 100.

Phase noise measurements using the PNMM 100 and system 200 according to the present invention are performed in a manner analogous to conventional phase noise measurements. Namely, the SUT having the carrier frequency $f_c$ is applied to the input of the spectrum analyzer 10'. The switch 14 of the spectrum analyzer 10' is configured to route the SUT to the RF input 102 of the PNMM 100. A division factor N is selected for the selectable frequency divider 120 and the switches 130, 140, 150 of the PNMM 100 are configured according to which IF frequency is produced based on the selected division factor N and carrier frequency $f_c$. The spectrum analyzer 10' sweeps a frequency range corresponding to a range containing the SUT carrier frequency $f_c$ and measures signal power detected in a given, selectable bandwidth at a number of frequencies within the frequency range. The detected power of the SUT at the carrier frequency $f_c$ and at various offset frequencies are used, as described hereinabove, for conventional phase noise measurements.

Selecting the division factor N, configuring the switches 130, 140, 150, and determining an appropriate frequency range to sweep are a function of the input RF signal frequency $f_{RF}$ and a frequency conversion plan of the system 200 as one skilled in the art can readily recognize. The frequency conversion plan includes information regarding the frequencies $f1_{IF}, f2_{IF}, f2_{IF}$ of the first, second, and third IF stages 20', 30, 40 of the spectrum analyzer 10' as well as the tuning range of the tunable LO signal $S1_{LO}(t)$ and the available division factors N.

One skilled in the art, given knowledge of the frequency plan, can accomplish the selecting, configuring, and determining manually. However, preferably a controller (not illustrated) implements a control algorithm to perform selecting, configuring and determining. More preferably, the controller is part of the spectrum analyzer 10' and the control algorithm is a computer program executed by the controller, the control program being stored in memory of the spectrum analyzer. The control algorithm includes information regarding the frequency conversion plan. When executed, the control program selects the division factor N, configures the switches 130, 140, 150, and controls the sweep range given information regarding the RF signal frequency $f_{RF}$. The control program may require an input from a user of the system 200 when more than one possibility exists for an allowed selection, configuration, and/or sweep range given the frequency plan and RF signal frequency $f_{RF}$.

To better understand and appreciate the features and advantages of the PNMM 100 and its use in the system 200 of the present invention, consider the following example. The following example is provide solely for illustrative purposes and does not limit the scope of the present invention in any way. For the example, the RF spectrum analyzer 10' has an input RF frequency range of 0 to 3 GHz, a first IF frequency $f1_{IF}$=3.9214 GHz, a second IF frequency $f2_{IF}$=321.4 MHz, and a third IF frequency $f3_{IF}$=21.4 MHz. The frequency range of the first LO needed to achieve the RF signal range of 0 to 3 GHz is 3.9214 GHz to 6.9214 GHz in this case. The actual tuning range of the first LO may be and is often wider. Since the PNMM 100 divides the frequency $f1_{IF}$ of the tunable LO to reduce its phase noise, the frequency range of the divided tunable LO is reduced. Thus, it is desirable to utilize an available full tuning range of the tunable LO in conjunction with the PNMM 100 to maximize the tuning range of the divided LO. For this example, the available full tuning range of the tunable LO 26' is 3 to 7 GHz. In addition, the selectable frequency divider 120 of the PNMM 100 has a selectable division factor N that can be selected to be any one value of the set of values {2, 4, 8, 16, 32}.

Table 1 provides a frequency conversion plan for the system 200 of this example. The frequency conversion plan in Table 1 utilizes both 'high-side' and low-side' conversions to maximize the coverage of the RF frequency range. The frequency conversion plan is based on a well know relationship between RF, LO and IF frequencies in a frequency conversion given by equation 1.

$$f_{IF} = |f_{RF} \pm f_{LO}| \quad (1)$$

TABLE 1

Frequency conversion plan of the system 200 for the example.

| N | PNMM Min LO (MHZ) | PNMM Max LO (MHz) | Input RF Range 321.4 MHz IF (MHz) | Input RF Range 21.4 MHz IF (MHz) | Phase Noise Reduction (dB) |
|---|---|---|---|---|---|
| 2 | 1500 | 3500 | 1178.6–3821.4 | 1478.6–1521.4 | 6.0 |
| 4 | 750 | 1750 | 428.6–2071.4 | 728.6–1771.4 | 12.0 |
| 8 | 375 | 875 | 53.6–1196.4 | 353.6–896.4 | 18.0 |
| 16 | 187.5 | 437.5 | 0.0–758.9 | 166.1–458.9 | 24.0 |
| 32 | 93.75 | 218.75 | 0.0–540.15 | 72.35–240.15 | 30.0 |

The column in Table 1 labeled 'N' represents the selected division factor N of the PNMM 100. The columns labeled 'PNMM Min LO' and 'PNMM Max LO' represent, respectively, the minimum and maximum frequencies of the frequency divided LO signal $SN_{LO}(t)$ at the output of the selectable divider 120 given an available tuning range of the tunable LO signal $S1_{LO}(t)$ of the first conversion stage 20' of the spectrum analyzer 10'. The column in Table 1 labeled 'Input Range 321.4 MHz IF' provides the RF frequency range of the SUT that can be converted by the PNMM 100 of the example to the second IF frequency $f2_{IF}$=321.4 MHz for the corresponding selected division factor N and the available tuning range. Similarly, the column labeled 'Input Range, 21.4 MHz IF' provides the RF frequency range of the SUT that can be converted by the PNMM 100 of the example to the third IF frequency $f3_{IF}$=21.4 MHz for the corresponding selected division factor N and available tuning range. Thus, if the SUT has a carrier frequency $f_c$=1000 MHz, a division factor N equal to either 4 or 8 can be used to measure SUT phase noise according to Table 1.

For example, if the division factor N is selected to be 8, the signal is converted to the second IF frequency by tuning the frequency divided LO signal $SN_{LO}(t)$ to 678.6 MHz. With the division factor N=8, this corresponds to setting the tunable LO 26' of the spectrum analyzer 10' to $f1_{LO}$=5428.8 MHz. If the division factor N=4 is selected, then either a frequency divided LO signal $SN_{LO}(t)$ frequency of 1321.4 MHz (i.e., $f1_{LO}$=5285.6 MHz) or a frequency divided LO signal $SN_{LO}(t)$ frequency of 978.6 MHz (i.e., $f1_{LO}$=3914.4 MHz) can be used. Using the frequency divided LO signal $SN_{LO}(t)$ frequency of 1321.4 MHz converts the SUT to the second IF frequency $f2_{IF}$=321.4 MHz while using the frequency divided LO signal $SN_{LO}(t)$ frequency of 978.6 MHz converts the SUT at 1 GHz to the third IF frequency $f2_{IF}$=21.4 MHz.

As is evident in Table 1, there is considerable frequency overlap in the RF frequency range (i.e., some frequencies can be converted to an IF frequency in more than one way using the PNMM 100). Advantageously, this overlap facilitates processing an SUT that has spurious components at image frequencies of a particular conversion. In general, the division factor N is chosen to minimize added phase noise (i.e., a highest division factor value is chosen that enables processing a particular SUT). However, if the SUT has known spurious components, another division factor may be used to avoid the spurious components. Moreover, the spectrum analyzer 10' advantageously can be used in a conventional way by configuring the switches 140, 150 of the PNMM 100 appropriately to search for and identify spurious components.

The column in Table 1 labeled 'Phase Noise Reduction' indicates a theoretical reduction in added phase noise that may be achieved in phase noise measurements using the PNMM 100 and system 200 of the present invention. The phase noise reduction listed in Table 1 is based on the use of a frequency divided LO signal and direct frequency conversion of the PNMM 100 as compared to using the conventional LO signal $S1_{LO}(t)$ and conventional first conversion stage 20 of the spectrum analyzer 10 alone.

Figure 6:
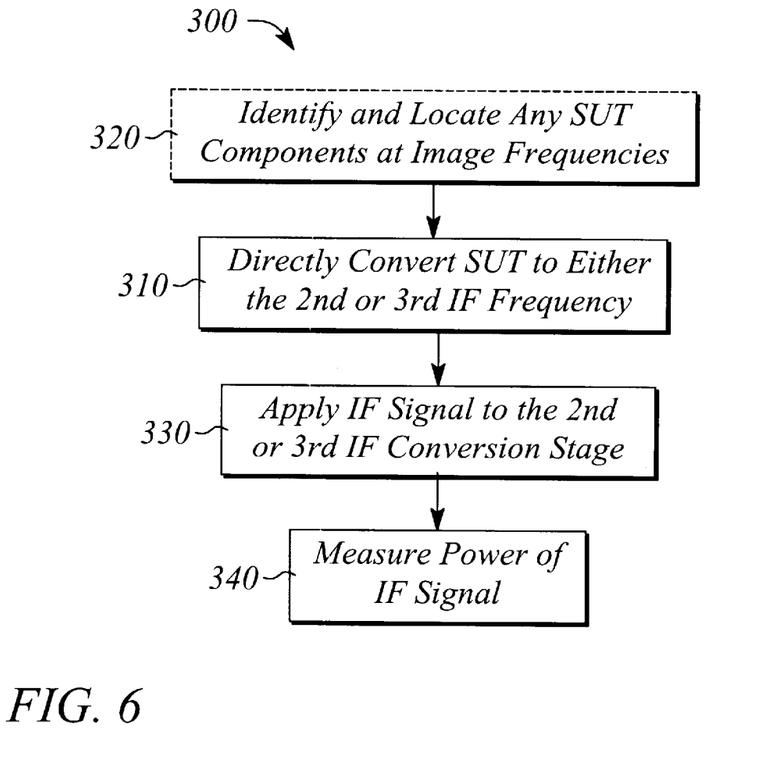
FIG. 6 illustrates a flow chart of a method of measuring phase noise according to the present invention.
Figure 7:
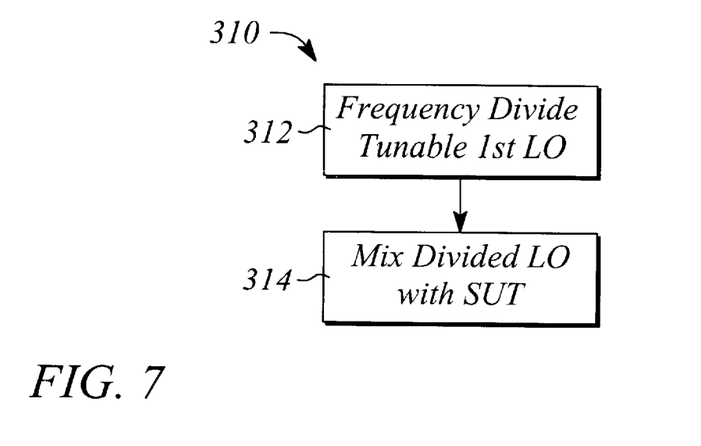
FIG. 7 illustrates a flow chart of a method of direct conversion according to the present invention.

In another aspect of the present invention, a method 300 of measuring phase noise using a spectrum analyzer is provided. FIG. 6 illustrates a flow chart of the method 300 of measuring. The method 300 of measuring phase noise comprises directly converting 310 an input SUT to produce an IF signal $S_{IF}(t)$ centered at either a second IF frequency $f2_{IF}$ or a third IF frequency $f3_{IF}$ of the spectrum analyzer. A flow chart of a method 310 of directly converting is illustrated in FIG. 7. The method of directly converting 310 comprises frequency dividing 312 a tunable LO signal and mixing 314 the divided tunable LO signal with the SUT to produce an IF signal $S_{IF}(t)$.

The method 300 of measuring phase noise optionally further comprises identifying and locating 320 any frequency components of the SUT that occur at image frequencies of the direct conversion. When performed, the step of identifying and locating 320 usually precedes the step of directly converting 310 since which of the second IF frequency $f2_{IF}$ or a third IF frequency $f3_{IF}$ is used for the conversion 310 depends on the results of the step 320. The optional step of identifying and locating 320 in FIG. 6 is illustrated as a 'dashed box' for that reason. Preferably, the step of identifying and locating 320 uses the spectrum analyzer. For example, the optional step of identifying and locating 320 may be omitted if it is known a priori that there are no frequency components of the SUT at image frequencies of the conversion. One of ordinary skill in the art can readily determine if the step of identifying and locating 320 is desired in a given situation without undue experimentation. Moreover, one skilled in the art is familiar with using a spectrum analyzer to identify and locate 320 frequency components of the SUT that occur at image frequencies of the direct conversion.

The method 300 further comprises applying 330 the IF signal $S_{IF}(t)$ produced in the step of converting 310 to either the second IF conversion stage or the third IF conversion stage of the spectrum analyzer. The IF signal is applied 330 to a particular IF conversion stage according to which IF conversion stage has the same IF frequency as that of the IF signal $S_{IF}(t)$. Thus, the IF signal $S_{IF}(t)$ is applied 330 to the second conversion stage if the frequency of the IF signal $S_{IF}(t)$ produced by the conversion 310 of the SUT is centered at the second IF frequency $f2_{IF}$. Alternatively, the IF signal $S_{IF}(t)$ is applied 330 to the third conversion stage if the conversion of the SUT produces the IF signal $S_{IF}(t)$ with a frequency that is centered at the third IF frequency $f3_{IF}$.

As mentioned above, the frequency conversion 310 and subsequent application 330 of the IF signal to either the second or third conversion stage of the spectrum analyzer depends on the frequency plan of the spectrum analyzer and the SUT frequency $f_{RF}$. In addition, the specific conversion 310 used may depend on which, if any, frequency components are known to be at critical image frequencies in the SUT. If the optional step of identifying and locating 320 is performed, then the selection can be based on the results of that step.

The method 300 further comprises measuring 340 signal power of the IF signal $S_{IF}(t)$ at an IF carrier frequency $f_{c,IF}$ and at a plurality of frequencies $f_m$ offset from the carrier frequency $f_{c,IF}$. The measured signal power is recorded as a set of measured data values from which the phase noise $\mathcal{L}(f_m)$ of the SUT is computed. Phase noise is computed in the conventional way by using the measured data to produce a power spectrum of the SUT and computing the phase noise $\mathcal{L}(f_m)$ from the power spectrum by taking a ratio of the power measured at the plurality of offset frequencies $f_m$ to power measured at the IF carrier frequency $f_{c,IF}$.

Thus, there have been described a direct-conversion apparatus or phase noise measurement module (PNMM) 100, a system 200, and a method 300, that facilitate improved measurement accuracy when used in conjunction with a spectrum analyzer to measure phase noise of a signal under test (SUT). It should be understood that the above-described embodiments are merely illustrative of the some of the many specific embodiments that represent the principles of the present invention. Clearly, those skilled in the art can readily devise numerous other arrangements without departing from the scope of the present invention as defined by the following claims.

What is claimed is:

1. A phase noise measurement module for use with a spectrum analyzer having multiple frequency conversion stages that include a first frequency of a first frequency conversion stage, the module comprising:
   a direct conversion apparatus that directly converts an RF signal under test to an IF signal having a frequency centered at an IF freQuency of a selected one of a second IF frequency and a third IF frequency of a respective second frequency conversion stage or third frequency conversion stage of the spectrum analyzer.

2. The phase noise measurement module of claim 1, wherein the direct conversion apparatus bypasses at least the first frequency conversion stage of the spectrum analyzer.

3. The phase noise measurement module of claim 1, wherein the direct conversion apparatus has an RF input port, an LO input port and an IF output port, and comprises:
   an RF to IF frequency converter having an RF input port connected to the apparatus RF input port, an LO input port, and an IF output port connected to the apparatus IF output port; and
   a selectable frequency divider having an input port connected to the apparatus LO input port and an output port connected to the LO input port of the RF to IF frequency converter, the selectable frequency divider further having a selectable division factor.

4. The phase noise measurement module of claim 3, wherein the selectable frequency divider comprises:
   a frequency divider having an input port connected to the selectable frequency divider input port, the frequency divider having a first division factor; and
   a selectable divider module having an input port connected to an output port of the frequency divider, the selectable divider module having a second division factor, wherein a combination of the first division factor and the second division factor equals the selectable division factor.

5. The phase noise measurement module of claim 4, wherein the selectable frequency divider further comprises:
   a selectable lowpass filter module connected between the selectable divider module and the output port of the selectable frequency divider.

6. The phase noise measurement module of claim 5, wherein the selectable lowpass filter module comprises:
   a set of lowpass filters; and
   a switch that switches between lowpass filters of the set, wherein each lowpass filter of the set has a different cutoff frequency corresponding to a different selectable division factor.

7. The phase noise measurement module of claim 5, wherein the selectable lowpass filter module comprises:
a set of lowpass filters; and
a switch that switches between lowpass filters of the set, wherein each lowpass filter of the set has a cutoff frequency corresponding to a different frequency within a range of frequencies at the output port of the selectable divider module.

8. The phase noise measurement module of claim 3, wherein the direct conversion apparatus further comprises:
a switch having an input port connected to the IF output port of the RF to IF frequency converter and an output port connected to the apparatus IF output port, wherein the switch routes the IF signal from the frequency converter to either the second conversion stage or the third conversion stage of the spectrum analyzer via the apparatus IF output port, depending on the respective IF frequency.

9. The phase noise measurement module of claim 3, wherein the direct conversion apparatus further comprises:
a plurality of switches, a first switch having an input port connected to the IF output port of the RF to IF frequency converter, a second switch having a first input port connected to a first output port of the first switch, and a third switch having a first input port connected to a second output port of the first switch,
wherein the second switch and the third switch each has an output port, the output ports of the second switch and of the third switch being connected to different IF output ports of the apparatus, and
wherein one apparatus IF output port connects to an IF input of the second conversion stage of the spectrum analyzer and another apparatus IF output port connects to an IF input of the third conversion stage of the spectrum analyzer.

10. The phase noise measurement module of claim 9, wherein the second switch and the third switch each further comprises a second input port, and the apparatus further has two IF input ports, the second input port of the second switch being connected to a first IF input port of the apparatus, the second input port of the third switch being connected to a second IF input port of the apparatus, and wherein the apparatus first IF input port and the apparatus second IF input port connect to an IF output of the second conversion stage and an IF output of the third conversion stage of the spectrum analyzer, respectively.

11. The phase noise measurement module of claim 10, wherein one or both of the second switch connects the IF output to the IF input of the second conversion stage and the third switch connects the IF output to the IF input of the third conversion stage.

12. A system for measuring phase noise comprising:
a spectrum analyzer having multiple frequency conversion stages that include a first frequency of a first frequency conversion stage; and
a phase noise measurement module that directly converts an RF signal under test having a center frequency to an IF signal having a center frequency centered at an IF frequency of a selected one of a second IF frequency and a third IF frequency of a second frequency conversion stage or a third frequency conversion stage of the spectrum analyzer, respectively.

13. The system of claim 12, wherein the phase noise measurement module bypasses at least a the first frequency conversion stage of the spectrum analyzer.

14. The system of claim 12, wherein the spectrum analyzer comprises a first stage having a tunable local oscillator with an output connected to an LO output of the analyzer, a second stage having an IF input, and a third stage having an IF input, and
wherein the phase noise measurement module has an RF input port that receives the RF signal under test, an LO input port connected to the analyzer LO output, and an IF output port connected to the IF inputs of the second and third stages of the analyzer.

15. The system of claim 14, wherein the phase noise measurement module (PNMM) comprises:
an RF to IF frequency converter having an RF input port connected to the PNMM RF input port and having an IF output port connected to the PNMM IF output port; and
a selectable frequency divider having an input port connected to the PNMM LO input port and an output port connected to an LO input port of the RF to IF frequency converter, the selectable frequency divider further having a selectable division factor.

16. The system of claim 15, wherein the selectable frequency divider comprises:
a frequency divider having an input port connected to the selectable frequency divider input port, the frequency divider having a first division factor; and
a selectable divider module having an input port connected to an output port of the frequency divider, the selectable divider module having a second division factor, wherein a combination of the first division factor and the second division factor equals the selectable division factor.

17. The system of claim 16, wherein the selectable frequency divider further comprises:
a selectable lowpass filter module having an input port connected to an output of the selectable divider module and an output port connected to the output port of the selectable frequency divider.

18. The system of claim 15, wherein the phase noise measurement module (PNMM) further comprises:
a switch having an input port connected to the IF output port of the RF to IF frequency converter and an output port connected to the PNMM IF output port, wherein the switch routes the IF signal from the frequency converter to either the second conversion stage or the third conversion stage of the spectrum analyzer via the PNMM IF output port, depending on the respective IF frequency.

19. The system of claim 15, wherein the phase noise measurement module (PNMM) further comprises:
a plurality of switches, a first switch having an input port connected to the IF output port of the RF to IF frequency converter, a second switch having a first input port connected to a first output port of the first switch, and a third switch having a first input port connected to a second output port of the first switch,
wherein the second switch and the third switch each has an output port, the output ports of the second switch and of the third switch being connected to different IF output ports of the PNMM, and
wherein one PNMM IF output port connects the output port of the second switch to the IF input of the second conversion stage of the spectrum analyzer and another PNMM IF output port connects the output port of the third switch to the IF input of the third conversion stage of the spectrum analyzer.

20. The system of claim 19, wherein the PNMM further has different IF input ports, and wherein the second switch and the third switch each further having a second input port, the second input port of the second switch being connected to a first IF input port of the PNMM, the second input port of the third switch being connected to a second IF input port of the PNMM, and wherein the spectrum analyzer further has an IF output of the second conversion stage and an IF output of the third conversion stage, the PNMM first IF input port being connected to the second stage IF output and the PNMM second IF input port being connected to the third stage IF output, such that the IF output of the second frequency conversion stage of the spectrum analyzer is connected to the second switch and the IF output of the third frequency conversion stage of the spectrum analyzer is connected to the third switch.

21. The system of claim 20, wherein one or both of the second switch connects the IF output to the IF input of the second frequency conversion stage and the third switch connects the IF output to the IF input of the third frequency conversion stage.

22. A method of measuring phase noise using a spectrum analyzer that has multiple frequency conversion stages that includes a first frequency of a first frequency conversion stage, the method comprising:

directly converting a RF signal under test to an IF signal having a frequency centered at an IF frequency of a selected one of a second IF frequency and a third IF frequency of a respective second frequency conversion stage or a third frequency conversion stage of the spectrum analyzer before phase noise is measured.

23. The method of claim 22, wherein the RF signal under test is directly converted into an IF signal comprising:

frequency dividing a tunable LO signal from the first frequency conversion stage of the spectrum analyzer; and mixing the divided tunable LO signal with the RE signal under test to produce the IF signal.

24. The method of claim 22, optionally further comprising identifying and locating any frequency components of the RF signal under test that occur at image frequencies of the direct conversion prior to the step of directly converting.

25. The method of claim 22, wherein the IF signal is applied to either the second frequency conversion stage or the third frequency conversion stage of the spectrum analyzer, depending on whether the frequency of the IF signal is centered at the IF frequency of the second frequency conversion stage or the third frequency conversion stage.

26. The method of claim 22, further comprising measuring signal power of the IF signal at an IF carrier frequency and at a plurality of frequencies offset from the carrier frequency, and measuring phase noise of the RF signal under test using the measured signal power.

27. The method of claim 26, wherein the step of measuring signal power comprises recording the signal power measurements as a set of measured data values, and the step of measuring phase noise comprises computing the phase noise of the RF signal under test from the set of measured data values.

28. The method of claim 26, wherein the step of computing comprises producing a power spectrum of the signal under test from the set of measured data values, and computing the phase noise from the power spectrum by taking a ratio of the power measured at the plurality of offset frequencies to the power measured at the IF carrier frequency.

29. The method of claim 22, wherein the signal under test is directly converted into an IF signal by bypassing at least the first frequency conversion stage of a the spectrum analyzer, thereby reducing phase noise added to the signal under test by a tunable LO in the first conversion stage.

* * * * *